United States Patent
Wang et al.

(10) Patent No.: US 8,518,748 B1
(45) Date of Patent: Aug. 27, 2013

(54) METHOD AND SYSTEM FOR PROVIDING A LASER SUBMOUNT FOR AN ENERGY ASSISTED MAGNETIC RECORDING HEAD

(75) Inventors: Lei Wang, Fremont, CA (US); Zongrong Liu, Pleasanton, CA (US); Pezhman Monadgemi, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 13/172,583

(22) Filed: Jun. 29, 2011

(51) Int. Cl.
*H01L 21/00* (2006.01)

(52) U.S. Cl.
USPC .............. 438/119; 257/E21.499; 369/44.14

(58) Field of Classification Search
USPC .................. 438/119, 458, 612; 369/44.14
See application file for complete search history.

(56) References Cited

U.S. PATENT DOCUMENTS

| | | | |
|---|---|---|---|
| 5,687,267 A | 11/1997 | Uchida | |
| 5,907,571 A | 5/1999 | Ogino et al. | |
| 6,164,837 A | 12/2000 | Haake et al. | |
| 6,485,198 B1 | 11/2002 | Chang et al. | |
| 6,534,794 B1 | 3/2003 | Nakanishi et al. | |
| 6,577,656 B2 | 6/2003 | Chen et al. | |
| 6,627,096 B2 | 9/2003 | Sherrer et al. | |
| 6,804,276 B2 | 10/2004 | Gen-ei et al. | |
| 6,811,853 B1 * | 11/2004 | Sherrer et al. | 428/138 |
| 6,858,871 B2 | 2/2005 | Okada | |
| 6,960,485 B2 | 11/2005 | Uemura et al. | |
| 7,217,955 B2 | 5/2007 | Hamaoka | |
| 7,371,017 B1 | 5/2008 | Shi et al. | |
| 7,449,905 B2 | 11/2008 | Shi et al. | |
| 7,502,397 B2 | 3/2009 | Naganuma | |
| 7,522,649 B2 | 4/2009 | Ha et al. | |
| 7,608,863 B2 | 10/2009 | Oda et al. | |
| 7,613,080 B2 | 11/2009 | Oozeki et al. | |
| 7,638,439 B2 | 12/2009 | Kubota et al. | |
| 7,687,810 B2 | 3/2010 | Mo | |
| 7,739,703 B2 | 6/2010 | Arai | |
| 2002/0089913 A1 | 7/2002 | Moriyama et al. | |
| 2002/0163865 A1 | 11/2002 | Zimmer et al. | |
| 2003/0002549 A1 | 1/2003 | Oh | |
| 2004/0231997 A1 | 11/2004 | Wang et al. | |
| 2007/0015313 A1 | 1/2007 | Kwak et al. | |
| 2008/0056073 A1 | 3/2008 | Shimizu | |
| 2008/0316872 A1 | 12/2008 | Shimizu et al. | |
| 2009/0035885 A1 | 2/2009 | Karlicek, Jr. et al. | |
| 2009/0207580 A1 | 8/2009 | Oshika et al. | |
| 2009/0219728 A1 | 9/2009 | Hata et al. | |
| 2010/0109030 A1 | 5/2010 | Krames et al. | |
| 2010/0238581 A1 | 9/2010 | Nakamura et al. | |
| 2011/0108896 A1 | 5/2011 | Feng et al. | |
| 2011/0116526 A1 * | 5/2011 | Sorimachi et al. | 372/46.012 |
| 2011/0265867 A1 | 11/2011 | Moslehi | |
| 2012/0026478 A1 * | 2/2012 | Chen et al. | 355/53 |
| 2012/0280344 A1 * | 11/2012 | Shastri et al. | 257/432 |

* cited by examiner

*Primary Examiner* — William D Coleman (57) ABSTRACT

A method and system for providing a laser diode submount for use in an energy assisted magnetic recording disk drive are described. A portion of a silicon substrate is removed, forming trenches therein. Each trench has sidewalls, surrounds a silicon island corresponding to a laser diode submount, and corresponds to a thickness of the laser diode submount. The silicon island has a top surface and a facets corresponding to the trench sidewalls. Insulator(s) for the top surface and facets of the silicon island are provided. Metallization is provided on the top surface and facets of the silicon island. A first portion of the metallization on the top surface corresponds to under bump metal (UBM) for solder pad(s). A second portion of the metallization corresponds to electrical traces. Solder pad(s) are provided on the UBM. The silicon island is released from the silicon substrate.

21 Claims, 9 Drawing Sheets

METHOD AND SYSTEM FOR PROVIDING A LASER SUBMOUNT FOR AN ENERGY ASSISTED MAGNETIC RECORDING HEAD

BACKGROUND

Figure 1:
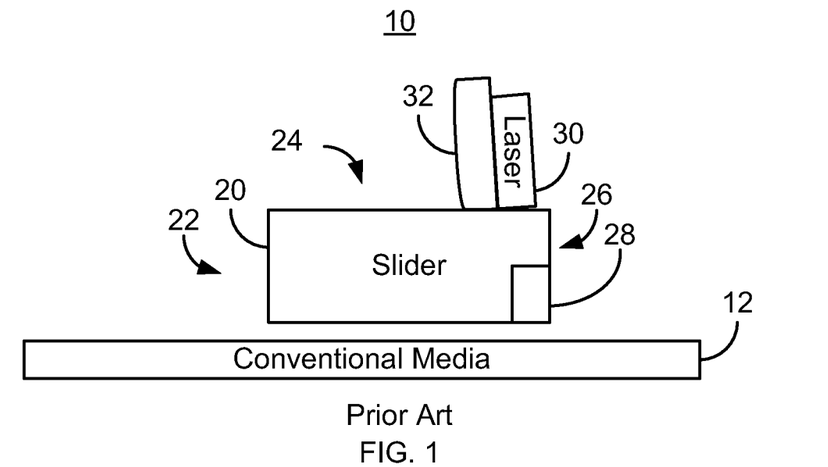
FIG. 1 is a diagram depicting a portion of a conventional energy assisted magnetic recording disk drive.

FIG. 1 depicts a side view of portion of a conventional energy assisted magnetic recording (EAMR) disk drive 10. FIG. 1 is not to scale. The conventional EAMR disk drive 10 includes a recording media 12, a conventional slider 20, and a conventional laser diode 30 that are typically attached to a suspension (not shown). The conventional slider 20 has a leading edge 22, a trailing edge 26, and a back side 24. Although termed "edges", the leading edge 22 and trailing edge 26 are surfaces of the slider 20. The leading edge 22 and trailing edge 26 are so termed because of the direction the conventional media 12 travels with respect to the EAMR transducer 28. Other components that may be part of the conventional EAMR disk drive 10 are not shown. The conventional slider 20 is typically attached to the suspension at its back side 24. A conventional EAMR transducer 28 is coupled with the slider 20.

The laser diode 30 is typically mounted on a conventional submount 32. The laser diode 30 and conventional submount 32 are coupled in proximity to the EAMR transducer 28 on the back side 24 of the slider 20. The conventional submount 32 is typically SiC, which is a high thermal conductivity insulator. The conventional submount may thus act as a heat sink for the laser diode 30. The conventional submount 32 may also have bond pads (not shown) and electrical traces (not shown). Thus, the conventional submount 32 is typically also desired to provide electrical and thermal connection as well as mechanical support to the laser diode 30.

In operation, light from the conventional laser diode 30 is provided to the EAMR transducer 28. More specifically, light from the laser diode 30 is provided to a waveguide (not shown) of conventional EAMR transducer 28. The waveguide directs the light toward the conventional media 12, heating a small region of the conventional media 12. The conventional EAMR transducer 28 magnetically writes to the conventional media 12 in the region the conventional media 12 is heated.

Figure 2:
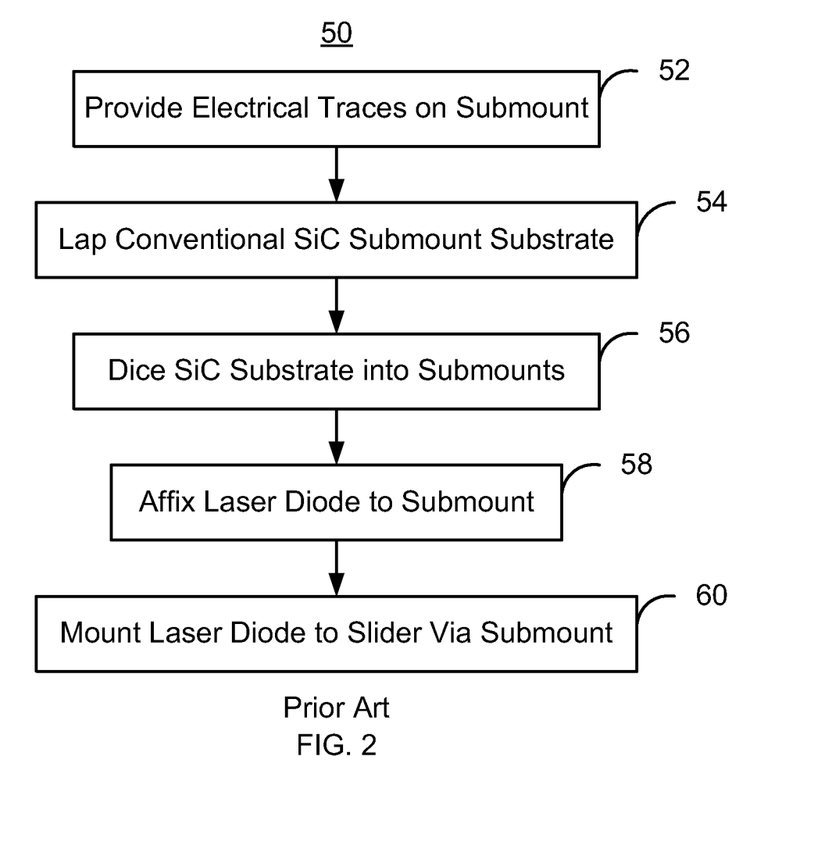
FIG. 2 is a flow chart depicting a conventional method for fabricating a conventional EAMR disk drive.

FIG. 2 depicts a conventional method 50 for mounting the laser diode 20 on the conventional EAMR disk drive 10. For simplicity, only a portion of the method 50 is described. The conventional submount 32 is prepared from a SiC substrate. Electrical traces for the submounts on the SiC substrate are provided, via step 52. The SiC substrate is lapped to reduce the thickness of the substrate, via step 54. The SiC substrate is then diced into the individual conventional submounts 32, via step 56. The faces of the substrate correspond to the faces of the submount to which the laser diode 30 is coupled. The laser 30 is affixed to the submount, via step 58. The laser diode 30 and conventional submount 32 are then mounted to the slider 20, via step 60. Fabrication of the conventional EAMR disk drive 10 may then be completed.

Although the conventional EAMR disk drive 10 and method 50 may function, improvements are desired. More specifically, properly aligning and coupling the laser diode 30 to the slider 20 and conventional submount 32 may be problematic. The sidewalls of the conventional submount 32 may be rough and chipped due to dicing. As a result, proper alignment of the conventional submount 32 to the slider 20 may be challenging. This may affect alignment of the laser diode 30, which is affixed to the conventional submount 32. For example the laser diode 30 may be tilted from vertical or otherwise misaligned as is shown in FIG. 1. The lapped surface of the conventional submount 32 may also be rounded, which is undesirable. The back surface of the conventional submount 32 shows such rounding in FIG. 1. Further, the electrical traces on the submount 32 may be misaligned. Thus, proper alignment of the laser diode 30 may be challenging. Such misalignments may adversely affect performance of the conventional EAMR disk drive 10.

Accordingly, improved methods and systems for coupling lasers with the slider in EAMR disk drives are desired.

BRIEF SUMMARY OF THE INVENTION

A method and system for providing a laser diode submount for use in an EAMR disk drive is described. A portion of a silicon substrate is removed to form trenches therein. The trenches have sidewalls and surround silicon islands corresponding to a laser diode submounts. Each of the trenches corresponds to a thickness of the laser diode submount. The silicon island has a top surface and a plurality of facets corresponding to the sidewalls of the plurality of trenches. At least one insulator for the top surface and the plurality of facets of the silicon island is provided. Metallization is provided on the top surface and the facets of the silicon island. A first portion of the metallization on the top surface corresponds to under bump metal (UBM) for at least one solder pad. A second portion of the metallization corresponds to electrical traces. At least one solder pad is provided on the UBM on the top surface of the silicon island. The silicon island is released from the silicon substrate.

BRIEF DESCRIPTION OF THE DRAWINGS

FIGS. 7A-21 are diagrams depicting an exemplary embodiment of an EAMR head during fabrication.

DETAILED DESCRIPTION OF EMBODIMENTS OF THE INVENTION

Figure 3:
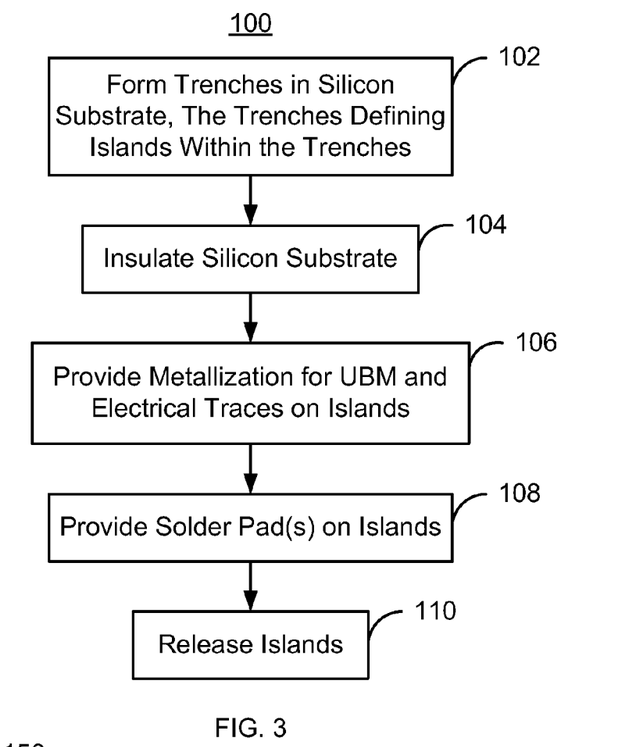
FIG. 3 is a flow chart depicting an exemplary embodiment of a method for fabricating a laser submount usable in an EAMR disk drive.

FIG. 3 is a flow chart depicting an exemplary embodiment of a method 100 for a laser submount that may be used in conjunction with EAMR heads. Although certain steps are shown, some steps may be omitted, interleaved, performed in another order, and/or combined. Further, although described in the context of mounting a laser for an EAMR head, in other embodiments, the submount may be used for other purposes. The EAMR heads may be merged heads, each of which includes an EAMR write transducer, a read transducer (not shown) and resides on a slider.

The method commences with a silicon substrate. The silicon substrate has a high thermal conductivity. A portion of a silicon substrate is removed, via step 102. In some embodiments, step 102 include performing a silicon reactive ion etch (RIE), such as a deep RIE. Step 102 may include forming a hard mask having apertures corresponding to the trenches. Stated differently, the size, shape, and location of the apertures correspond to the trench size, shape, and location. The hard mask may be formed by depositing a hard mask layer, providing a photoresist mask on the hard mask layer using photolithography, and transferring the pattern of the photoresist mask to the hard mask layer. In other embodiments, the mask may be other than a hard mask and/or be formed in another manner. The hard mask may include silicon dioxide, silicon nitride, Ti, Ta, and/or Ni. However, in other embodiments, other materials may be used. The silicon RIE then removes the silicon exposed by the apertures. Thus, trenches are formed in the silicon substrate.

Each trench corresponds to one or more silicon island. Thus, the trenches can be considered to surround silicon islands. In some embodiments, a single trench surrounds a single silicon island. In other embodiments, trenches may combine to define one or more silicon islands. Trenches correspond to a thickness of the laser diode submount. In some embodiments, the depth of the trench is a desired thickness for the laser diode submount. In some embodiments, therefore, the trenches are at least fifty microns deep. In other embodiments, the trenches are at least one hundred microns deep. In still other embodiments, the trenches are at one hundred fifty microns deep. The trenches may be at least two hundred microns deep, depending upon the desired thickness for the submount.

The silicon islands formed in step 102 have top surfaces and facets (side faces) corresponding to the sidewalls of the trenches. Each silicon island corresponds to a laser submount. A single laser submount may be used for mounting one or more laser diodes. The top surface and facets form well controlled angles. In some embodiments, these angles are right angles. In some embodiments, the angles formed by the top surface and facets are at least 89.5 degrees and not more than 90.5 degrees.

At least one insulator is provided for the top surface and the facets of the silicon island, via step 104. In some embodiments, this includes forming insulator(s) on all surfaces of the silicon substrate, including the trench bottoms. In some embodiments, an insulating layer is deposited on the silicon substrate. In other embodiments, the insulating layer may be grown. The insulating layer may include materials such as silicon dioxide and silicon nitride.

Metallization is provided on the top surface and the plurality of facets of the silicon island, via step 106. A first portion of the metallization on the top surface of the islands corresponds to under bump metal (UBM) for solder pad(s). A second portion of the metallization corresponds to electrical traces. Because the metallization is provided on both the top surfaces and the facets of the silicon islands, the solder pads and electrical traces may be on the top surfaces and/or the facets of the silicon islands. Step 106 may include providing a mask having apertures corresponding to the locations of the electrical traces and UBM. The metallization may then be deposited. After deposition, the metallization mask may be removed. Deposition of the metallization may include depositing multiple layers. For example, step 106 generally includes blanket depositing multiple layers for at least the UBM. For example, an adhesion layer, a barrier layer and a top metal layer may be deposited. The adhesion layer assists ensuring that subsequent layers, including the solder pad(s), adhere to the silicon. In some embodiments, the adhesion layer may include one or more of Ti, Cr, and Ta. The barrier layer aids in ensuring that the adhesion layer is not melted or otherwise disturbed by the use of the solder and the processing temperatures required. In some embodiments, the barrier layer includes at least one of Pt, Ni, Pd, and W. The top metal layer may include materials such as Au, Al and/or Cu. In some embodiments, the same metallization may be used for the UBM and for the electrical traces. However, in other embodiments, different masks and/or different metallization may be used for the UBM and the electrical traces.

At least one solder pad is provided on the UBM on the top surfaces of the silicon islands, via step 108. In some embodiments, solder pads may also be provided on the UBM on the desired facets of the silicon island. Step 108 may be performed by providing a mask having apertures corresponding to the desired locations of the solder pads and depositing solder pads. The mask may then be removed.

The silicon islands are released from the silicon substrate, via step 110. Step 110 may include temporarily mounting the silicon substrate to a carrier substrate top side down. In other words, the surface of the silicon substrate in which the trenches and silicon islands are formed is bonded to the carrier substrate. Temporary adhesive such as thermal tape, epoxy, and/or wax might be used to bond the silicon substrate to the carrier substrate. The silicon substrate is then thinned from the back side. For example, the silicon substrate may be ground down. The grinding ceases before the trenches in the silicon substrate have been exposed. In some embodiments, grinding ceases a distance of at least ten microns from the bottom of the trench. In other embodiments, the grinding is terminated when the exposed surface of the silicon is at least twenty microns from the bottom of the trench. For example, a silicon substrate having a total thickness of seven hundred microns and a trench depth of two hundred microns might have approximately four hundred ninety microns of silicon removed from the backside by grinding. The silicon substrate may then be etched to the trench bottom. For example, a silicon RIE might be used. In other embodiments, a wet etch might be employed. Thus, the silicon substrate is removed to the bottom of the trench. In the regions of the trench, only the insulating layer and/or the metallization connect the islands to the remaining portion of the silicon substrate. The insulating layer and metallization may then be removed, for example via appropriate ion milling. In other embodiments, no additional materials reside at the trench bottom. In such embodiments, removal of the silicon substrate separates the silicon islands. Thus, the silicon islands are no longer connected to the remaining portions of the substrate. The silicon islands may then be released from the carrier substrate. Thus, individual laser diode submounts have been formed.

Figure 4A:
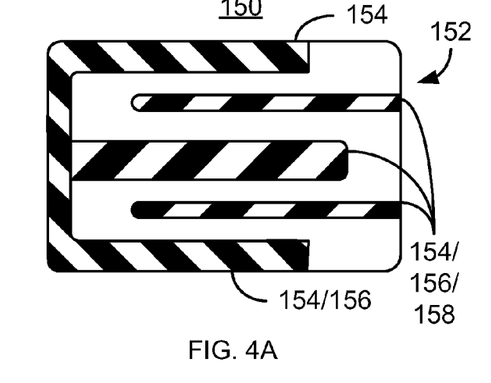
FIG. 4 is a diagram depicting an exemplary embodiment of a submount.
Figure 4B:
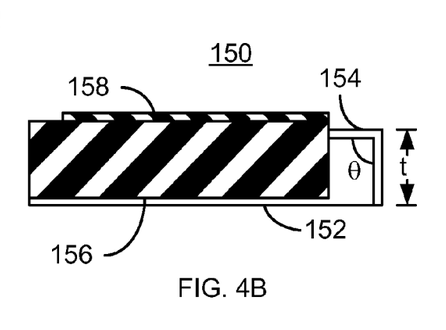

FIGS. 4A and 4B depict top and side views, respectively, of an exemplary embodiment of a laser submount 150 fabricated using the method 100. For clarity, FIGS. 4A and 4B are not to scale. The substrate 152 for the laser submount 150 is a silicon substrate. In some embodiments, the submount 150 has a thickness, t, of not more than two hundred microns thick. In other embodiments, the submount 150 is not more than one hundred and fifty microns thick. The silicon island has been separated from the remaining silicon substrate by trenches (not shown) and the process described above and used to form the submount 150. Also shown are insulating layer 154, metallization 156 and solder pads 158. In the top view, the metallization 156 also underlies the solder pads 158. Similarly, the insulator 154 underlies the metallization 156. Thus, some structures are labeled 154/156/158 to indicate the presence of multiple layers.

Using the method 100, laser submount 150 may be fabricated. As can be seen in FIG. 4B, the angle, θ, between the facet (side) of the submount 150 and the top surface is well controlled and in the embodiment shown, approximately ninety degrees. This is because as a removal process such as an RIE was used to define the silicon islands. The RIE also results in reduction or elimination of chipping and analogous issues with the sidewalls. Consequently, alignment of the laser (not shown) to a slider (not shown) may be improved. In addition, metallization 156 may be provided on the top surface and facets of the laser submount. Because of the insulating layer 154, the metallization is not shorted through the silicon substrate. Further, solder pads 158 have been formed. Although shown only on the top surface, solder pads may also be provided on the facets of the laser submount 150. Because wafer level photolithography is used in providing the metallization/UBM 156 and the solder pads 158, the alignment of the electrical traces and solder pads so formed may be improved. Furthermore, the silicon substrate 152 has a relatively high thermal conductivity while being electrically insulated by insulator 154. Thus, heat management of the laser can be provided while allowing for electrical connection to be made to desired portions of the slider and laser. As such, fabrication of an EAMR head or other device using a laser, as well as performance of the EAMR head or other device may be improved.

Figure 5:
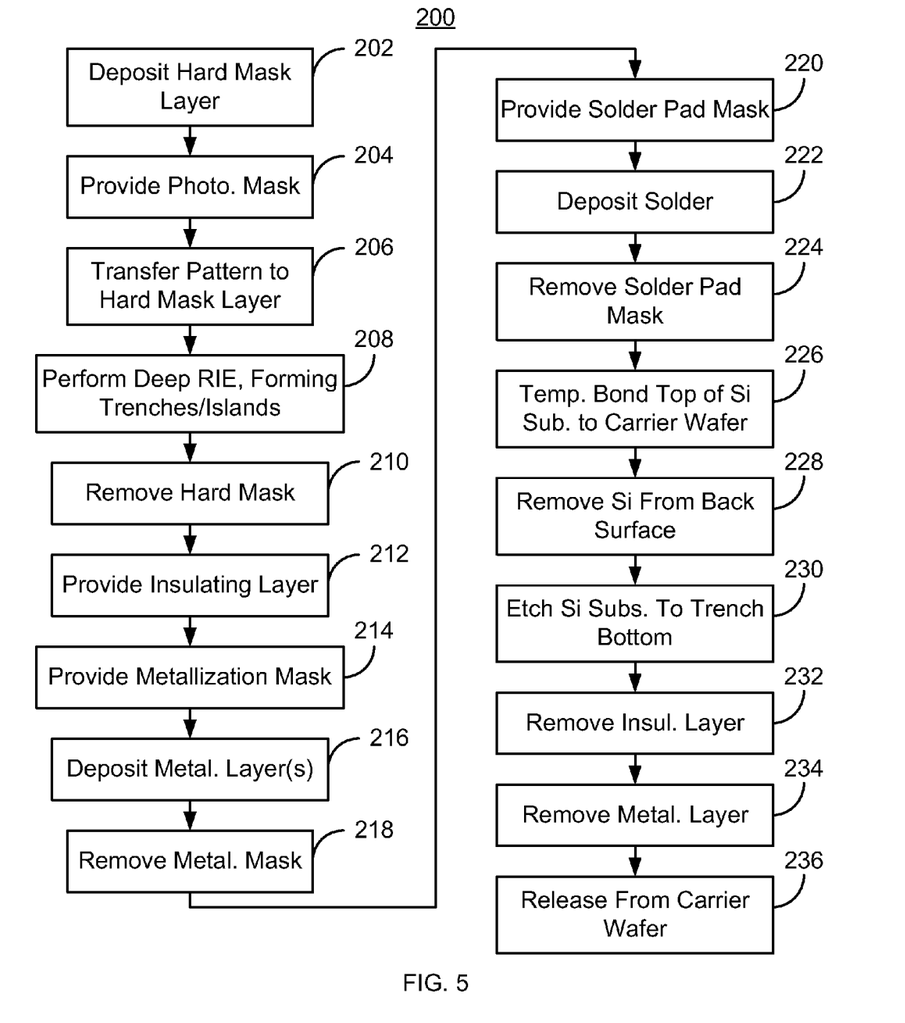
FIG. 5 is a flow chart depicting another exemplary embodiment of a method for fabricating a laser submount usable in an EAMR disk drive.

FIG. 5 is a flow chart depicting another exemplary embodiment of a method 200 for fabricating a laser submount. FIGS. 6A-20B are diagrams depicting portions of a laser submount during fabrication. For clarity, FIGS. 6A-20B are not to scale. Further, for simplicity, not all components are labeled in FIGS. 6A-20B. Referring to FIGS. 5-20B, the laser submount 250 being fabricated may be used in connection with an EAMR head and reside on a slider of a disk drive. However, the laser submount may be used in another device. Although the method 200 is described in the context of a single laser submount depicted in FIGS. 6A-20B, multiple laser submounts are typically fabricated in parallel. Further, the laser submount depicted in FIGS. 6A-20B may be used to mount a laser diode, such as a GaAs laser diode. However, in other embodiments, other lasers, other diodes, and/or other components may be mounted on the submount.

Figure 6A:
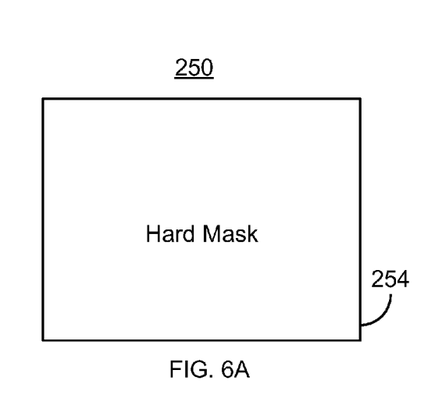
FIG. 6 is a flow chart depicting another exemplary embodiment of a method for fabricating a laser submount that may be used in an EAMR disk drive.
Figure 6B:
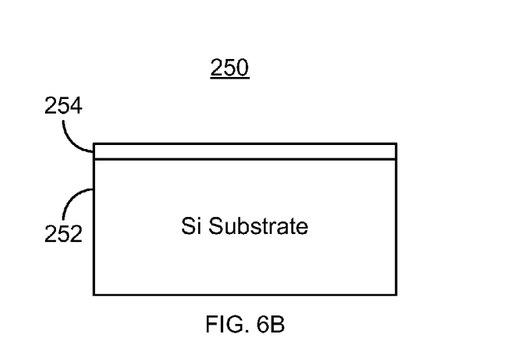

A hard mask is first formed on a silicon substrate in steps 202-206. Thus, a hard mask layer is deposited on the silicon substrate, via step 202. In some embodiments, the hard mask layer consists of silicon dioxide. In other embodiments, the hard mask may include or consist of other materials such as silicon nitride. The silicon substrate has a top surface and a back surface opposite to the top surface. The hard mask layer is on the top surface of the substrate. FIGS. 6A and 6B depict top and side views of the laser submount 250 after step 202 has been performed. Thus, a silicon substrate 252 having a hard mask layer 254 deposited on the top is shown.

Figure 7A:
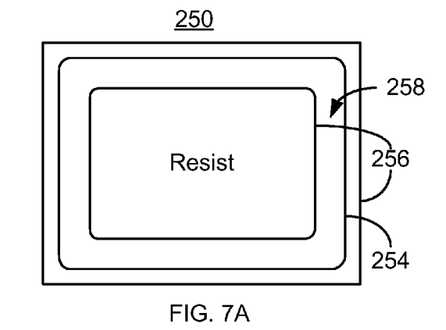
Figure 7B:
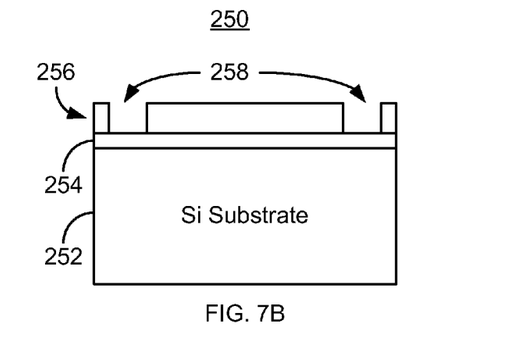

A photoresist mask having a pattern corresponding to the desired trenches is provided on the hard mask layer, via step 204. In some embodiments, step 204 includes depositing a photoresist layer and patterning the photoresist layer using photolithography. FIGS. 7A and 7B depict top and side views of the submount 250 after step 204 is performed. Thus, a mask 256 having aperture 258 is shown.

Figure 8A:
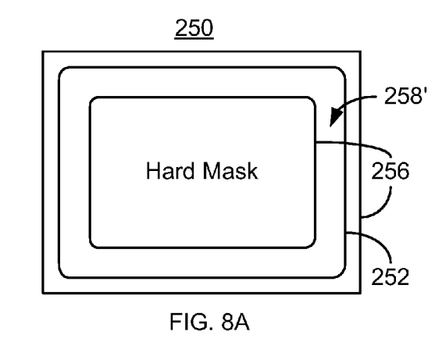
Figure 8B:
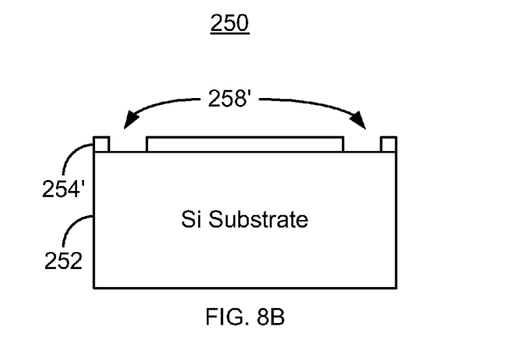

The pattern of the photoresist mask 256 is transferred to the hard mask layer, via step 206. In some embodiments, a RIE or other etch process appropriate to the hard mask is used. The photoresist mask may also be stripped as part of step 206. Thus, a hard mask having apertures corresponding to the pattern is formed. FIGS. 8A and 8B depict top and side views of the submount 250 after step 206 is performed. The apertures 258' have thus been transferred to the hard mask 254'. As a result, the underlying portion of the silicon substrate 252 is exposed.

Figure 9A:
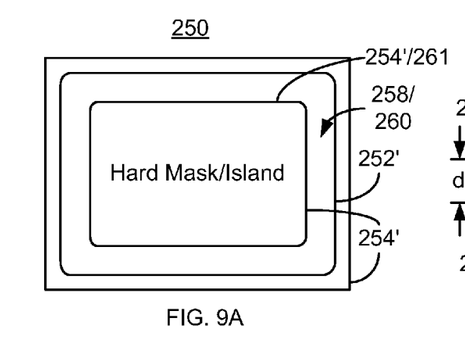
Figure 9B:
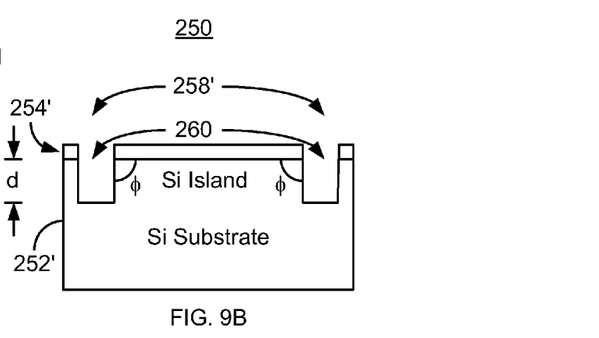

A deep silicon RIE is performed, via step 208. The silicon RIE removes a portion of the silicon substrate 252 exposed by apertures 258'. Trenches are thus formed in the silicon substrate 252. FIGS. 9A and 9B depict top and side views of the submount 250 after step 208 is performed. Trenches 260 have been formed in the silicon substrate. Each of the trenches 260 surrounding a silicon island 261 corresponding to a laser diode submount being formed. Each trench 260 has a trench bottom, sidewalls, and a depth, d. The depth corresponds to a desired thickness for the laser diode submount 250. The depth is at least one hundred microns. In some embodiments, the depth is at least two hundred microns. The trench may be wide. In some embodiments, the trenches 260 are at least one hundred microns and not more than one hundred fifty microns wide. However, other widths may be used. A typical silicon substrate 252 is approximately seven hundred microns thick. Thus, the depth of the trenches 260 is less than seven hundred microns (e.g. less than the depth of the silicon substrate). This is because the silicon islands 21 are desired to remain attached to the substrate 252 during fabrication. The silicon island 261 has a top face (shown in FIG. 9A) and facets corresponding to the sidewalls of the trenches 260. In some embodiments, the top face of the silicon island 261 measures approximately 400 microns by 700 microns. However, in other embodiments, the dimensions may differ. For example, in one embodiment, the dimensions may be 350 microns by 400 microns. As can be seen in FIG. 9B, the top face and the facets forming a top angle, $\phi$, of at least 89.5 degrees and not more than 90.5 degrees. In the embodiment shown in FIGS. 9A and 9B, the same angle, $\phi$, is shown at multiple facets. In other embodiments, different facets may make different angles with the top surface of the silicon island 261. However, in some embodiments, all of these angles are within 0.5 degree of ninety degrees.

The hard mask 254' is removed, via step 210. In embodiments in which a silicon dioxide hard mask 254' is used, a solution such as buffered HF may be used to remove the hard mask.

Figure 10A:
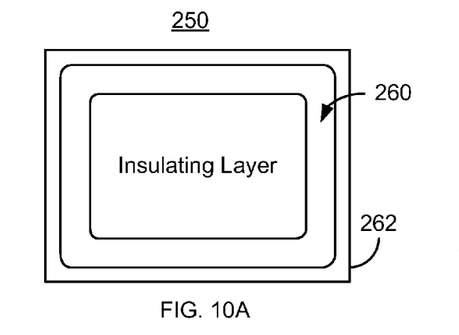
Figure 10B:
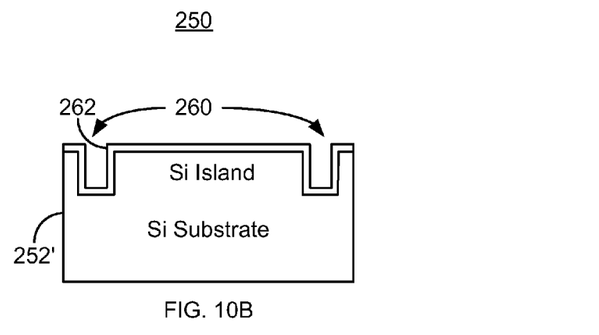

An insulating layer is then provided on the substrate 252', via step 212. Step 212 may include depositing or growing the insulating layer. The insulating layer may be silicon dioxide, silicon nitride, or some other insulator on the top face and the facets of the silicon island 261. FIGS. 10A and 10B depict the submount 250 after step 212 is performed. Thus, trenches 260 remain. However, an insulating layer 262 has been provided. In some embodiments, the insulating layer 262 covers the entire top surface of the silicon substrate 252'. For example, the insulating layer 262 not only resides on the top face and facets of the island 261, but also at the bottom of the trenches. For simplicity the silicon island 261 is numerically labeled only in FIG. 9A. The insulating layer 262 is used to electrically insulate the silicon substrate 252 from the metallization, described below.

Figure 11A:
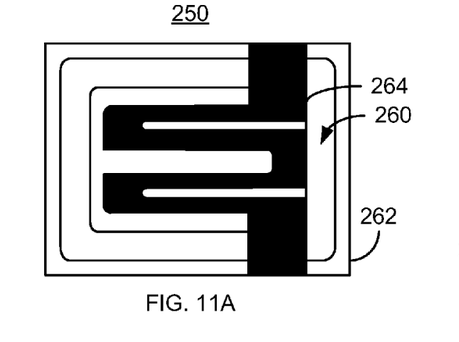
Figure 11B:
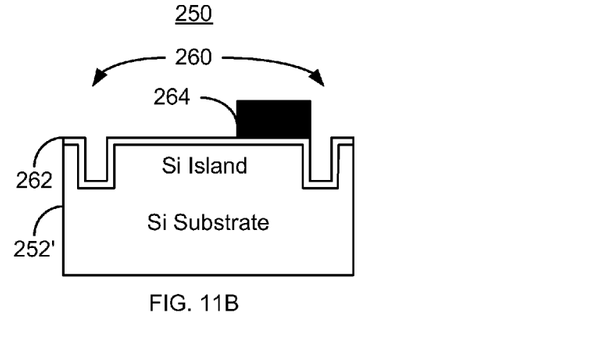

A metallization mask is provided, via step 214. Step 214 may include depositing a photoresist layer and patterning the photoresist layer using photolithography. The metallization mask has a metallization mask pattern. This pattern includes one or more apertures for the metallization to be provided. The apertures thus correspond to one under bump metal (UBM) to be provided on the top surface and/or facets of the silicon island 261 and for electrical traces for the silicon island 261. FIGS. 11A and 11B depict top and side views of the submount 250 after step 214 is performed. Thus, a metallization mask 264 has been provided. In the embodiment shown, the metallization mask 264 only exposes regions in which the metallization is desired. Thus, part of the metallization mask 264 resides in and covers portions of the trenches 260.

Figure 12A:
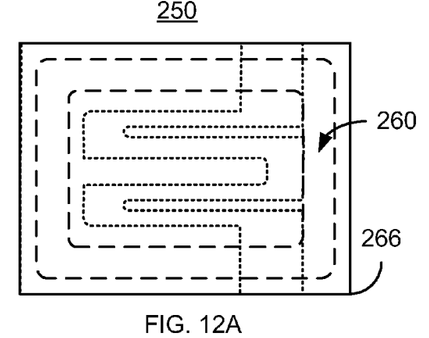
Figure 12B:
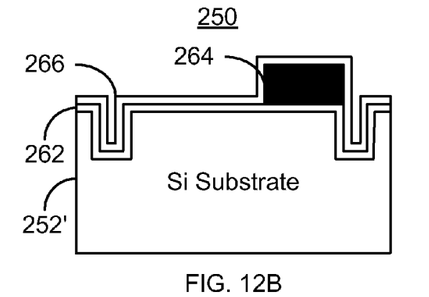

The metallization layer(s) are deposited, via step 216. In some embodiments the metallization is blanket deposited. Deposition of the metallization layer(s) in step 216 may include depositing an adhesion layer, depositing a barrier layer, and depositing an additional metal layer. These layers may be desirable for use as the UBM for solder pads. In some embodiments, the portion of the metallization layer(s) to be used as UBM is fabricated at substantially the same time as the layers for the electrical traces. Thus, the same materials (including adhesion, barrier, and metal layers) may be used for both. Processing may thus be simplified. However, in other embodiments, the metallization for the electrical traces may be provided separately from the metallization for the UBM. Materials used for the metallization may include one or more of Au, Ti, Ta Ni, Pt, Cu, and Cr. FIGS. 12A and 12B depict top and side views of the submount 250 after step 216 is performed. Some underlying features are denoted in the top view by dashed or dotted lines. The metallization 266 is thus shown. Portions of the metallization are on the metallization mask 264.

Figure 13A:
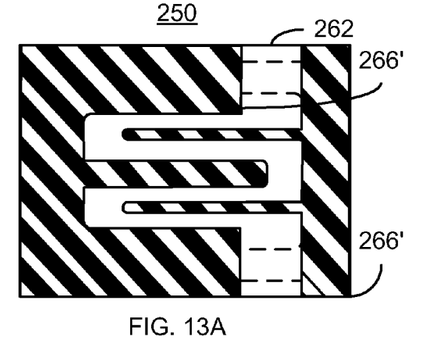
Figure 13B:
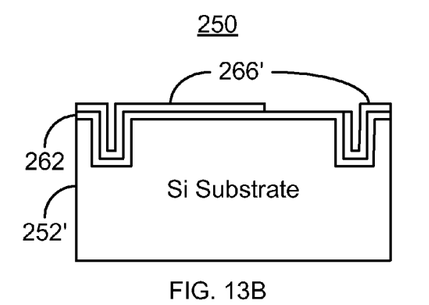

The metallization mask is removed, via step 218. Step 218 may include stripping the photoresist metallization mask 264. FIGS. 13A and 13B depict the submount after step 218 is performed. Some underlying features are denoted in the top view by dashed or dotted lines. Thus, metallization 266' remains. The region previously covered by the metallization mask 264 now exposes the insulating layer 262. Trenches 260 are still denoted by dotted lines. Thus, the metallization may be provided in steps 214-218.

Figure 14A:
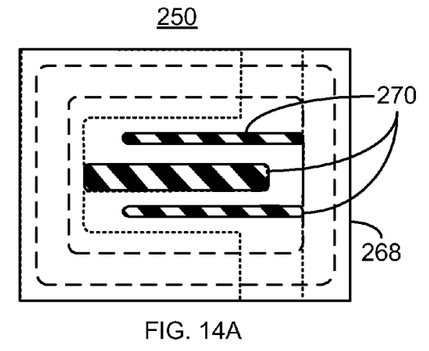
Figure 14B:
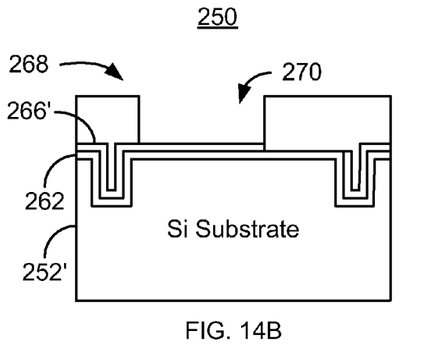

A solder pad mask is provided, via step 220. Step 220 may include depositing a photoresist layer and patterning the photoresist layer using photolithography. The solder pad mask has solder pad mask pattern. This pattern includes apertures corresponding to the size, shape, and location of the desired solder pads. FIGS. 14A and 14B depict side and top views of the submount 250 after step 220 is performed. Some underlying features are denoted in the top view by dashed or dotted lines. A solder bond pad mask 268 is shown. Some underlying features are denoted in the top view by dashed or dotted lines. The mask 268 includes apertures 270 therein. The apertures 270 expose the underlying metallization 266'.

Solder for the solder pads is deposited, via step 222. In some embodiments, step 222 includes depositing at least one of Ti, In, Pt, Au, Sn, In, Pb, Bi, Sb, Cu, Ag, and their alloys.

Figure 15A:
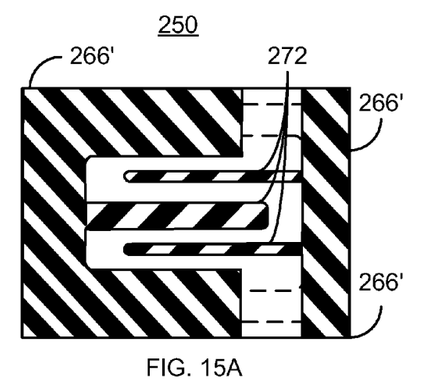
Figure 15B:
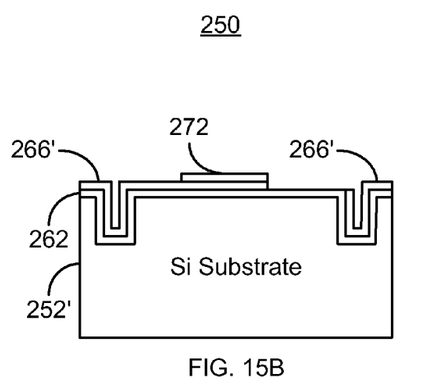

The solder pad mask is removed, via step 224. Thus, solder pads have been provided in steps 220-224. FIGS. 15A and 15B depict top and side views, respectively, of the submount 250 after step 224 is performed. Solder pads 272 have been deposited on a portion of the metallization 266'. This portion of the metallization 266' may be considered to be UBM for these solder pads 272.

Figure 16:
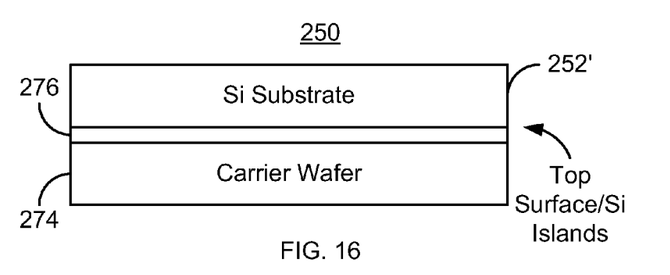

The silicon islands 261 are then separated from the silicon substrate 252, using step 226-236. The top surface of the silicon substrate 252' is temporarily bonded to a carrier substrate, via step 226. Thus, the silicon islands face the carrier substrate. The temporary bond formed in step 226 may be carried out using wax, photoresist, temporary epoxy, and/or thermal tape. FIG. 16 depicts a side view of the laser submount 250 after step 226 is performed. Thus, the silicon substrate 252' is attached to carrier substrate 274 through temporary bond 276.

Figure 17A:
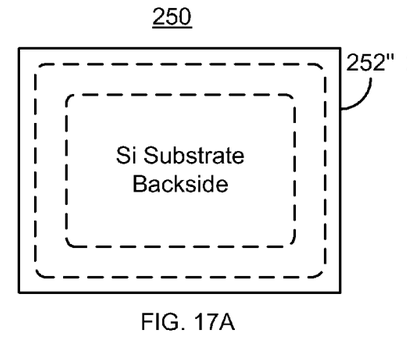
Figure 17B:
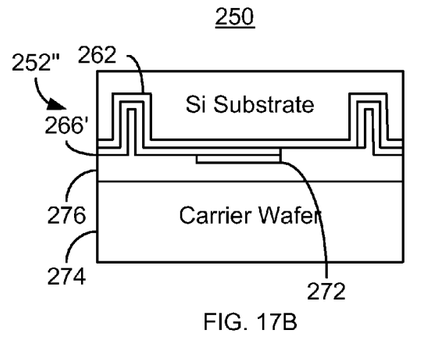

A portion of silicon substrate is removed from the back surface, via step 228. In some embodiments, step 228 is preformed through grinding and/or lapping. Thus, the silicon substrate 252' is thinned. FIGS. 17A and 17B depict back side and side views of submount 250 after step 228 is performed. The silicon substrate 252" has been thinned. An interior surface of the silicon substrate 252" has been exposed. This surface is a small distance from the trench bottom (shown as dashed lines in FIG. 17A). In some embodiments this distance is not more than twenty microns. In some such embodiments, the distance is not more than ten microns.

Figure 18A:
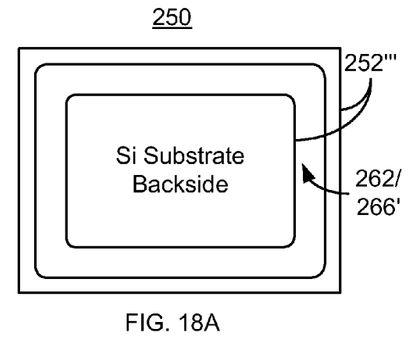
Figure 18B:
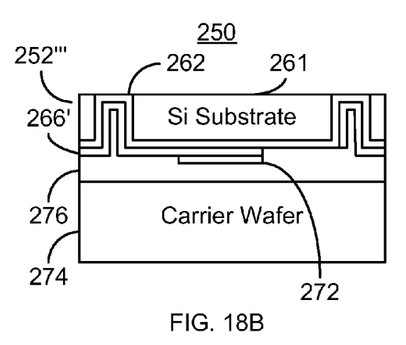

A remaining portion of the silicon substrate is removed, via step 230. The bottom of the trench may thus be considered to be exposed. In some embodiments, step 230 is performed using a silicon RIE. In other embodiments, a Si wet etch may be used. Because a silicon removal process is used, the removal process stops at the insulating layer 262 or the metallization layer(s) 266'. FIGS. 18A and 18B depict the submount 250 after step 230 is performed. Thus, the insulating layer 262 is exposed from the back side of the substrate 252". The silicon islands 261 have been separated from the silicon substrate. The islands are still connected via metallization 266' and/or insulating layer 262. However, this connection is very thin.

Figure 19A:
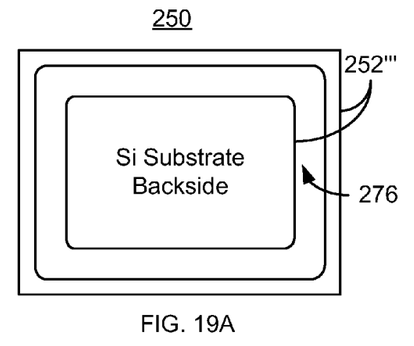
Figure 19B:
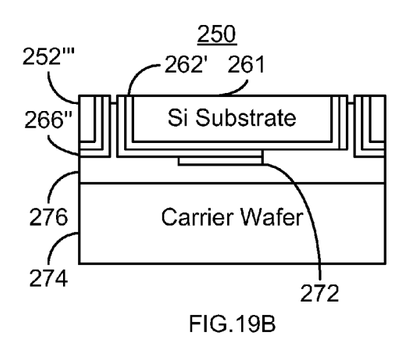

A portion of insulating layer is removed, via step 232. Step 232 may be performed using a silicon dioxide RIE or ion milling. Thus, a portion of metallization layer(s) 266' on the trench bottom are exposed. The exposed portion of the metallization layer(s) is also removed, via step 234. In some embodiments, step 234 is performed using an ion mill. FIGS. 19A and 19B depict backside and side views of the submount 250 after step 232 is performed. Thus, the temporary bond 276 may be exposed. The islands 261 are held together only by the temporary bond 276.

Figure 20A:
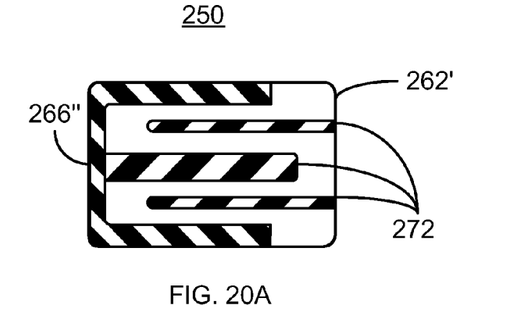
Figure 20B:
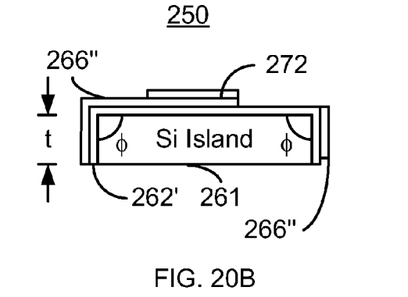

The silicon island 261 is released from the carrier substrate, via step 236. Thus, the temporary bond 276 is removed. FIGS. 20A and 20B depict the submount 250 after step 236 is performed. Thus, metallization 266" and solder pads 272 have been provided on a silicon island 261 having an insulating layer 262'.

Figure 21:
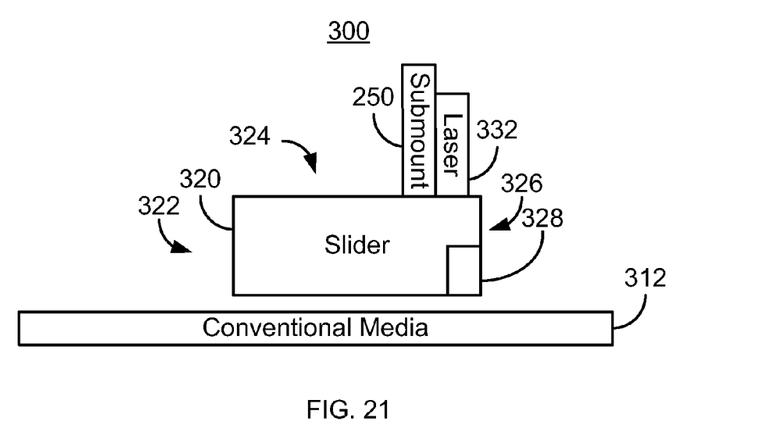

FIG. 21 depicts one use of the submount 250. In particular, FIG. 21 depicts an EAMR disk drive 300 including media 312, slider 320 having leading edge 322, trailing edge 326 and back side 324. Also shown is an EAMR transducer 328 and layers 332. The submount 250 formed using the method 200 is also shown. The laser diode 332 has been affixed to the submount 250 and the combination mounted on the slider 320.

Referring to FIGS. 5-21, using the method 200, the submount 250 may be formed. The submount 250 shares the benefits of the submount 150. The angle, φ, between the facet (side) of the submount 150 and the top surface is approximately ninety degrees. Chipping and analogous issues with the sidewalls may also be mitigated or eliminated. Consequently, alignment of the laser 332 to the slider 250 may be improved. In addition, metallization 266" may be provided on the top surface and facets of the laser submount. Because of the insulating layer 262', the metallization is not shorted through the silicon island 261. Further, solder pads 272 have been formed. Although shown only on the top surface, solder pads may also be provided on the facets of the laser submount 250. Because wafer level photolithography is used in providing the metallization/UBM 266" and the solder pads 272, the alignment of the electrical traces and solder pads so formed may be improved. Furthermore, the silicon island 261 has a relatively high thermal conductivity while being electrically insulated by insulator 262'. Thus, heat management of the laser 332 can be provided while allowing for electrical connection to be made to desired portions of the slider 320 and laser 332. As such, fabrication of an EAMR head 300 or other device using a laser as well as performance of the EAMR head or other device may be improved.

We claim:

1. A method for providing a plurality of laser diode submounts for use in an energy assisted magnetic recording (EAMR) disk drive comprising:
    removing a portion of a silicon substrate to form a plurality of trenches therein, the plurality of trenches having sidewalls and surrounding a silicon island corresponding to a laser diode submount of the plurality of laser diode submounts, the plurality of trenches corresponding to a thickness of the laser diode submount, the silicon island having a top surface and a plurality of facets corresponding to the sidewalls of the plurality of trenches;
    providing at least one insulator for the top surface and the plurality of facets of the silicon island for the plurality of trenches;
    providing metallization on the top surface and the plurality of facets of the silicon island for the plurality of trenches, a first portion of the metallization on the top surface corresponding to under bump metal (UBM) for at least one solder pad, a second portion of the metallization corresponding to electrical traces;
    providing at least one solder pad on the UBM on the top surface of the silicon island for the plurality of trenches;
    releasing the silicon island for the plurality of trenches from the silicon substrate.

2. The method of claim 1 wherein the step of removing the portion of the silicon substrate further includes:
    providing a hard mask on the top surface of the silicon substrate, the hard mask including a plurality of apertures therein, the plurality of apertures exposing the portion of the silicon substrate corresponding to the plurality of trenches; and
    performing a deep reactive ion etch to remove the portion of the silicon substrate.

3. The method of claim 1 wherein the plurality of trenches has a depth of at least fifty microns.

4. The method of claim 1 wherein the step of providing the at least one insulator for the top surface and plurality of facets further includes:
    growing at least one of a silicon nitride layer and a silicon dioxide layer on an exposed portion of the top surface and the plurality of facets.

5. The method of claim 1 wherein the step of providing the insulator corresponding to the top surface and plurality of facets further includes:
    depositing at least one of a silicon nitride layer and a silicon dioxide layer on an exposed portion of the top surface and the plurality of facets.

6. The method of claim 1 wherein the step of providing the metallization further includes:
    providing a metallization mask having a metallization mask pattern, the metallization mask pattern including at least one aperture corresponding to the UBM and the electrical traces; and
    blanket depositing the metallization.

7. The method of claim 1 wherein the step of providing the at least one solder pad further includes:
    providing a solder pad mask having a solder pad mask pattern, the solder pad mask pattern including at least one aperture corresponding to the at least one solder pad; and
    depositing solder.

8. The method of claim 1 wherein the silicon substrate has a top substrate surface including the island for the plurality of trenches and a back surface opposite to the top substrate surface, wherein each of the plurality of trenches has a trench bottom, and wherein the step of releasing the silicon island further includes:
    temporarily bonding the top substrate surface of the silicon substrate to a carrier substrate;
    removing a portion of silicon substrate from the back surface to expose an interior surface of the silicon substrate, the interior surface being a distance from the trench bottom;
    etching a remaining portion of the silicon substrate to the trench bottom;
    removing a portion of insulation, exposing a portion of the metallization on the trench bottom;
    removing the portion of the metallization; and
    releasing the silicon island corresponding to the plurality of trenches from the carrier substrate.

9. The method of claim 2 wherein the step of providing the hard mask further includes:
    depositing a hard mask layer;
    providing a photoresist mask having a pattern corresponding to the plurality of trenches; and
    transferring the pattern to the hard mask layer, thereby providing the hard mask.

10. The method of claim 9 wherein the hard mask layer includes at least one of silicon dioxide, silicon nitride, Ti, Ta, and Ni.

11. The method of claim 9 wherein each of the plurality of trenches has a top angle with the top surface of the silicon island, the top angle being at least 89.5 degrees and not more than 90.5 degrees.

12. The method of claim 9 wherein the step of removing the portion of the silicon substrate further includes:
    removing the hard mask.

13. The method of claim 3 wherein the depth is at least one hundred fifty microns.

14. The method of claim 3 wherein the depth is at least two hundred microns.

15. The method of claim 6 wherein the step of providing the metallization further includes:
    removing the metallization mask.

16. The method of claim 6 wherein the step of blanket depositing the metallization includes:
    depositing an adhesion layer including at least one of Ti, Cr, and Ta;
    depositing a barrier layer, including at least one of Pt, Ni, Pd, and W; and
    depositing a metal layer including at least one of Au and Cu.

17. The method of claim 7 wherein the step of providing the at least one solder pad further includes:
    removing the solder pad mask.

18. The method of claim 8 wherein the depth is not more than twenty microns.

19. The method of claim 8 wherein the depth is not more than ten microns.

20. The method of claim 8 wherein the step of temporarily bonding further includes using at least one of thermal tape and wax.

21. A method for providing a plurality of laser diode submounts for use in an energy assisted magnetic recording (EAMR) disk drive comprising:
    depositing a hard mask layer a silicon substrate, the hard mask layer consisting of silicon dioxide, the silicon substrate having a top surface and a back surface opposite to the top surface, the hard mask layer residing on the top surface;

providing a photoresist mask having a pattern on the hard mask layer;

transferring the pattern to the hard mask layer, thereby providing a hard mask having a plurality of apertures corresponding to the pattern, the plurality of apertures exposing a portion of the silicon substrate, performing a deep reactive ion etch to remove the portion of a silicon substrate thereby forming a plurality of trenches in the silicon substrate, each of the plurality of trenches surrounding a silicon island corresponding to a laser diode submount of the plurality of laser diode submounts, each of the plurality of trenches having a trench bottom, at least one sidewall and a depth corresponding to a thickness of the laser diode submount, the depth being at least one hundred microns, the silicon island having a top face and a plurality of facets corresponding to the at least one sidewall of each of the plurality of trenches, the top face and the plurality of facets forming at least one top angle of at least 89.5 degrees and not more than 90.5 degrees;

removing the hard mask;

providing an insulating layer including silicon dioxide on the top face and the plurality of facets of the silicon island in each of the plurality of trenches;

providing a metallization mask having a metallization mask pattern, the metallization mask pattern including at least one aperture for at least one under bump metal (UBM) on the top surface of the silicon island and for electrical traces for the silicon island, a portion of the metallization mask residing in the plurality of trenches;

depositing at least one metallization layer, the at least one metallization layer on the top surface and the plurality of facets of the silicon island for each of the plurality of trenches, a first portion of the metallization layer on the top surface corresponding to the at least one UBM for at least one solder pad, a second portion of the metallization corresponding to the electrical traces;

removing the metallization mask, a remaining portion of the at least one metallization layer forming the at least one UBM and the electrical traces;

providing a solder pad mask having a solder pad mask pattern, the solder pad mask pattern including at least one aperture corresponding to the at least one solder pad;

depositing solder for the at least one solder pad;

removing the solder pad mask;

temporarily bonding the top surface of the silicon substrate to a carrier substrate using at least one of wax and thermal tape;

removing a portion of silicon substrate from the back surface through grinding, the removing exposing an interior surface of the silicon substrate, the interior surface being a distance from the trench bottom of not more than ten microns;

etching a remaining portion of the silicon substrate to the trench bottom using a silicon reactive ion etch;

removing a portion of insulating layer through a silicon dioxide RIE, exposing a portion of the at least one metallization layer on the trench bottom;

removing the portion of the at least one metallization layer using an ion mill; and releasing the silicon island corresponding to each of the plurality of trenches from the carrier substrate.

* * * * *